United States Patent [19]

Vettiger et al.

[11] Patent Number: 4,475,037
[45] Date of Patent: Oct. 2, 1984

[54] METHOD OF INSPECTING A MASK USING AN ELECTRON BEAM VECTOR SCAN SYSTEM

[75] Inventors: Peter Vettiger, Langnau a/A, Switzerland; Alan D. Wilson, Mt. Kisco, N.Y.

[73] Assignee: International Business Machines Corporation, Armonk, N.Y.

[21] Appl. No.: 377,102

[22] Filed: May 11, 1982

[51] Int. Cl.³ .................. G01N 21/00; G01D 18/00; G12N 13/00
[52] U.S. Cl. .................. 250/252.1; 250/491.1
[58] Field of Search ............ 250/252.1, 306, 307, 250/398, 492.2; 378/34, 35

[56] References Cited

U.S. PATENT DOCUMENTS

| | | | |
|---|---|---|---|
| 3,855,023 | 12/1974 | Spicer et al. | 378/35 |
| 3,876,879 | 4/1975 | McAdams et al. | 250/307 |
| 4,218,142 | 8/1980 | Kryger et al. | 356/394 |

Primary Examiner—Bruce C. Anderson
Attorney, Agent, or Firm—Joseph E. Kieninger

[57] ABSTRACT

An electron beam fabricated mask used in the production of integrated circuits is tested by a method that includes the steps of forming a print of the mask and then inspecting the print by writing the same electron beam pattern or complement thereof on the print and detecting pattern coincidence and non-coincidence with a vector scan system.

7 Claims, 6 Drawing Figures

METHOD OF INSPECTING A MASK USING AN ELECTRON BEAM VECTOR SCAN SYSTEM

DESCRIPTION

1. Technical Field

This invention relates to mask inspection and more particularly to the electron beam vector scanning of an x-ray or optical print of the mask.

2. Background Art

In the production of integrated circuits it is usual to prepare a mask comprising a number of dies, usually several hundred dies arranged in regular rows and columns on a mask. To produce such a mask the design for a single layer of circuit is produced, from a drawing, painting, or the like, or, in the case of electron beam generated masks, from a digital data file, and sometimes are relatively large in size. Some masks are made at $1\times$ size, such as X-ray masks. At the present time, this circuit usually comprises a number of lines laid down in the proper design and generally may comprise this design in the form of a thin pattern of chromium or other material coated on the surface of a transparent carrier such as a glass slide or the like. The design generally is produced by photo-etch methods.

The first design may, but not necessarily, exists in a relatively enlarged size, called a reticle, and is used as the master for projection by means of a step-and-repeat camera onto a transparent surface which will become the mask. Ordinarily, this mask also is formed by photo-etch methods, and the step-and-repeat camera performs the exposure step of such photoresist procedure to position the dies in precise positions on the mask. Typically, several hundred reduced sized replicas of the original pattern will be formed in precise orientation and location on the mask surface. As a consequence of photoresist processing, there is formed the mask comprising a transparent surface, such as a piece of glass having several hundred dies on its surface, each die corresponding to an exact reduced size replica of the original reticle. Some electron beam generated masks are directly generated at $1\times$ to minimize defects and to easily add multiple part numbers to the final mask.

To produce complete integrated circuits, this mask and similar ones are used as masters for laying down individual layers of patterns, one on top of the other in precise position and orientation. Thus, each mask is used in combination with others to form several hundred completed integrated circuits. Such integrated circuits are then employed to form complex electronic equipment. While partial inspection of masks is generally carried out, the complexity is such that many mask defects are not detected during inspection. At the present time, in process inspection is unreliable or overly time-consuming and performance inspection cannot be done until manufacture of the integrated circuit is completed.

Heretofore, the testing of masks has generally been done individually by visual examination. A skilled worker looks at a mask through a microscope, or perhaps at a projection of the microscope image on a CRT display, to detect breaks in the lines of the mask, bulging lines which may touch other lines, or other mask defects. It is estimated that perhaps 25% or more of an entire production force may be engaged in such examination and testing and that such testing may, even so, fail to detect all or even most of the flaws, even though they actually are visible. As masks become more and more complex due to the growth of very large scale integration (VLSI) circuits, and the reduction in line widths coupled with the tendency to use larger and larger wafers and, thus, mask inspection becomes even more difficult and may even reach the point where a human simply cannot look through a microscope long enough to find all the defects or even a reasonable number of them. For example, consider a 125 mm (5 inch) square mask covered with 1 micron lines. It is desired to check this mask for 20% deviations from the 1 micron lines. Thus, the number of pixels is $(125\times 10^3-0.2)^2$ or about $4\times 10^{11}$ pixels. This is equivalent to inspecting a square mile for 0.10 inch square defects. This is a very formidable task.

One approach is to use a scanning spot from a laser beam and compare the position signal of the scan from the mask against a data base representing another mask. This mask analysis scheme is described in U.S. Pat. No. 4,218,142 and is an improvement over the visual examination done by individuals. This approach does not test the mask in the same environment in which the mask is to be used. As a result, transient defects which do not survive through to the developed print are detected. In addition, other defects that may be added or changed are not detected.

SUMMARY OF THE INVENTION

It is a primary object of this invention to provide an improved method of inspecting a mask.

It is another object of this invention to provide a method of inspecting masks in which the contrast for optimum detection of defects can be optimized by material selection.

It is yet another object of this invention to provide a method of inspecting a mask as it is used in situ.

It is still a further object of this invention to provide a method of inspecting the mask without subjecting the mask to additional defects introduced by the inspection process.

It is yet a further object of this invention to provide a method of inspecting masks that eliminates false defects and enhances the true defects.

These and other objects are accomplished by a mask inspection method which includes the steps of forming a print of the electron beam fabricated mask and then inspecting the print by writing the same electron beam pattern or complement thereof on the print and detecting pattern coincidence or non-coincidence with a vector scan system. In a preferred embodiment the mask is printed on a semiconducting substrate such as a silicon wafer in the same manner that the mask is normally used. For example, the wafer is coated with a photoresist suitable for a lift-off procedure. Removal of the lift-off photoresist leaves a print of the mask in a material such as gold having a high contrast to electrons used in the vector scan. A corresponding electron beam pattern formed from the same pattern data used to form the mask is overlaid and registered with the print. The points of coincidence or noncoincidence of the electron beam pattern with respect to the print is then detected by utilizing the vector scan system.

Other objects of this invention will be apparent from the following detailed description, reference being made to the accompanying drawings wherein the specific embodiments of the invention are shown.

DESCRIPTION OF PREFERRED EMBODIMENTS

Figure 1:
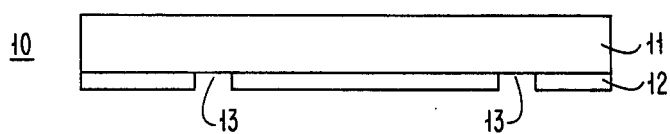
FIG. 1A is a cross-sectional view of a mask.

As shown in FIG. 1, a mask 10 consists of a glass substrate 11 and a metal pattern 12. A preferred metal for the pattern 12 is chromium. The mask 10 is to be inspected to see if there are any defects in the pattern 12.

Figure 2A:
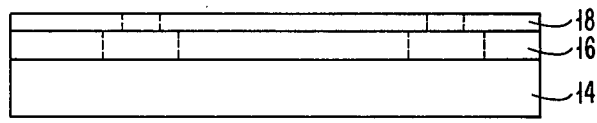
FIGS. 2A-2D are cross-sectional views showing the steps of forming a print from the mask.
Figure 2B:
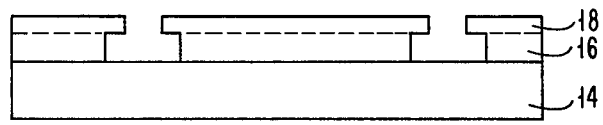
Figure 2C:
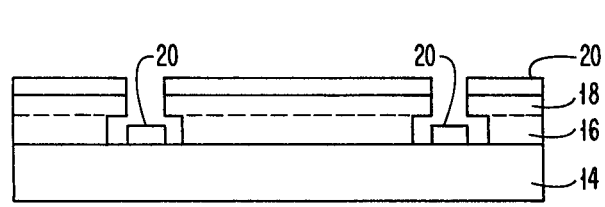
Figure 2D:
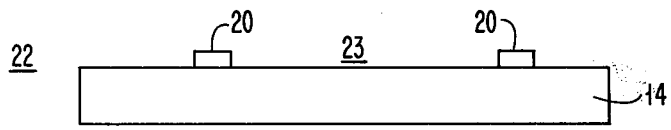

A print of the mask 10 is formed or printed on a semiconducting substrate 14 such as a silicon wafer by conventional techniques. Typically this includes using, for example, two lift-off photoresist layers 16 and 18 which have different optical sensitivities. After the photoresist layers 16 and 18 are exposed as shown in FIG. 2A, they are developed to provide the structure shown in FIG. 2B. A layer 20 of a high contrast material, that is, having a high contrast to electrons used in a subsequent vector scan at a suitable operating voltage, is deposited on top of and in the openings in photoresist layer 18 as shown in FIG. 2C. The photoresist layers are then removed to provide the print 22 consisting of the remaining metal layer 20 on the surface of the semiconducting substrate 14 as shown in FIG. 2D. A preferred material for the printed pattern 20 is gold. Gold provides a high contrast in the video signal with the substrate material 14. Because of the use of the high contrast material such as gold and the use of a high beam current, it is not necessary for signal averaging or complex signal processing in the vector scan system.

Figure 3:
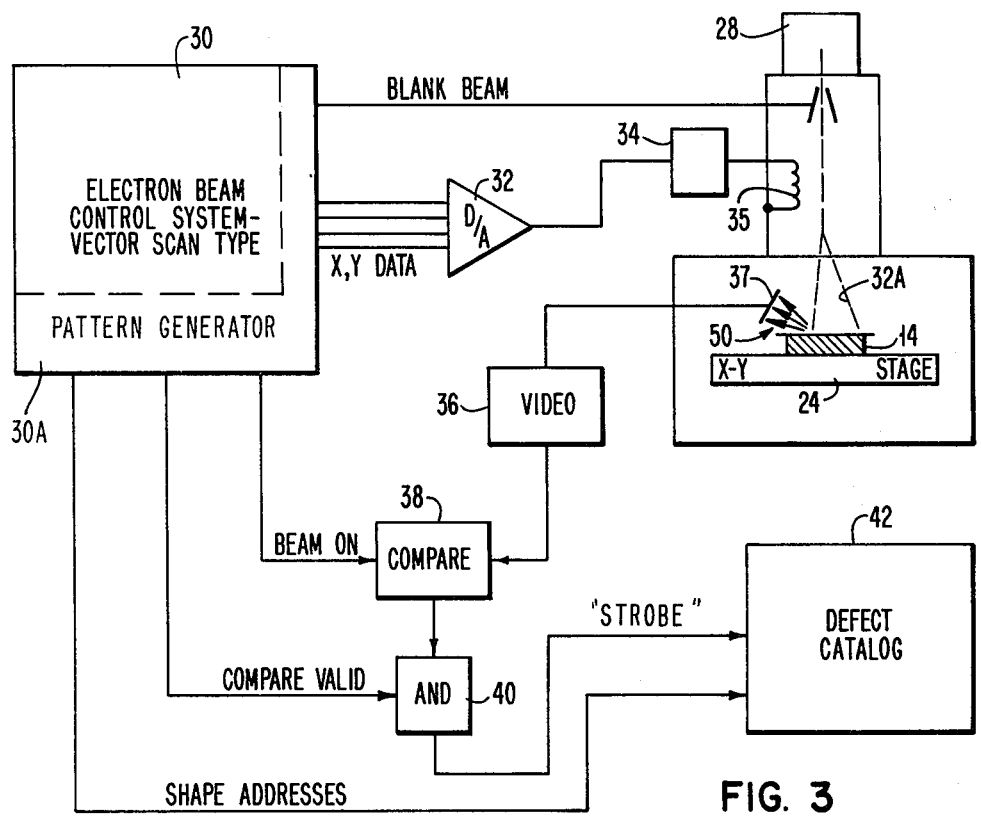
FIG. 3 is a block diagram in outline of mask inspection system according to one embodiment of the invention.
Figure 4:
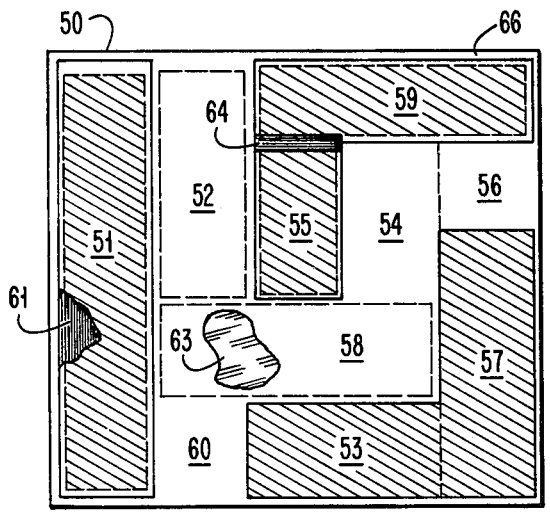

An outline of a system for a method of inspecting a mask is shown in FIG. 3. The print 21 of the mask (not shown) is on the sample 14. The sample 14 is positioned on an X,Y stage 24 or other mechanism for controlled movement of the sample 14 separately in the Y direction and the X direction to permit moving the entire area of the mask print on the sample 14 into and through an inspection zone. An electron beam 28 is controlled by scan control means 30 to sweep a controlled and very fine electron beam 32 onto and across a portion of the mask print on the sample 14 on stage 24.

The electron beam 32A is deflected by deflection D/A's 32 and amplifier 34 and coil 35 in a vector scan mode to scan printed shapes on the substrate 14. The shapes on the substrate 14 scatter electrons to the detector 37 which are amplified by the video amplifier 36. The pattern generator 30A which is "rewriting" the shape which is being checked/verified generates a "beam-on" signal which is compared with the backscattered signal 50 via comparator 38. If a defect such as a "missing shape" is found, then the pattern generator 30A would have a high signal and because of the absence of the shape no backscattering occurs and thus no video signal. Consequently, the compare is positive—A defect was found and made valid in 40 by coincidence of "compare valid" and compare 38 output. The result is stored in memory 42 along with the addresses (digital) of the shape scan so that the defect can be catalogued for further analysis.

The advantage of this mask inspection system over conventional optical systems is the inherent speed of electron beam systems. In this novel application of mask inspection, we are inspecting, not necessarily the original written mask, but rather a copy printed by, for example, X-ray lithography. The reason for examining the print of the mask rather than the mask itself is that in X-ray lithography we are concerned, not with mask defects per se, but rather with printable mask defects which can differ markedly from the mask itself because light atomic number dirt particles may not print as defects at all, whereas they would be significant defects when viewed in an optical microscope. On the mask copy we look for repeating defects—a defect which does not repeat copy to copy is a copy defect and not inherent in the mask itself. A repeating defect is a mask defect.

The wafer or sample 14 is placed in the vector scan system shown in FIG. 3 and the print on the sample 14 is registered to the system using wafer and chip mapping routines to scale the system parameters to those of the wafer such as size, orthogonality etc. After this is done, the vector scan system will effectively overlay the printed mask pattern with a virtual one written when the system is instructed to write.

The conditions for pattern "write" to do the inspection, that is beam clock rate, step size, etc., can be set to optimize the relationship between resolution at time of inspection and time to do the inspection. The pattern to "write" for inspection is really two patterns; the first pattern is the positive image, exactly what was clear on the mask (13 in FIG. 1), and the second pattern is the negative image, that is, what was opaque 12 on the mask. The first pattern will test for the opaque areas 12 in the mask that should be clear and the second pattern will test for the clear areas 13 in the mask (holes) that should be opaque.

When the video from the substrate print differs at the sample time from the beam on signal, then the compare circuit 38 will produce a positive indication of a defect. The size of the defect can be automatically met by recording the digital addresses of the electron beam and laser system automatically using zone detection circuits or simply dumping the digital data into a memory. The size of the defect detected, its smallness, can and would be set by the beam probe conditions and the beam stepping size much the same way it is now in writing a mask or wafer. Probably one-half the writing resolution is needed for the inspection, that is, twice the beam stepping distance, and thus inspection for both types of defects should take about one-half the time to write the original mask. It should be noted that the technique disclosed here does not detect errors in the digital input data for writing the original mask, but rather defects introduced by the wet process, resist, dirt, etc.

It is probable that defects will be discovered en masse printed on the wafer that are not really in the mask, but are associated with the wafer and resist and lift-off of the high contrast material. These are eliminated by inspecting two or more wafers, that is maybe two fields or more on the same wafer, and automatically comparing further the digital zones of the two sets of errors after the mask or groups of the mask have been inspected. Some interesting signal processing can be done at this point to detect true defects and reject random defects that are associated with the transfer process from mask to inspecting wafer. Several options are available. First, compare after the inspection is complete, the digital addresses of found errors/defects with some tolerance limit, for example, three microns. If there is good agreement of the digital addresses, then it is probable that the mask is bad. Secondly, if more than two fields are compared, then digital signal enhancement can be used where the frequency of occurrence of a particular error address is recorded. It is expected that the accuracy of proper defect detection and recording is substantially better than that presently obtained on current production lines.

The method in accordance with this invention using a printed sample of the mask for inspection results in several desirable features. One advantage is that the contrast for inspection can be selected by proper materials and system parameters for optimum detection of defects. Another advantage is that the mask itself is really tested as it is used, that is, in situ, and thus it is a real evaluation of what defects find there way onto the wafers. Another advantage is that the mask can remain in production and is not subject to additional defects introduced by the inspection process. A further advantage is that the inspection can be done automatically by electron beams without the need for special coatings on the mask which could possibly add new defects. A further advantage is that because of the speed of the electron beam system, several "images" can be compared to one another to eliminate the false defects and enhance the true defects.

Although a preferred embodiment of this invention has been described, it is understood that numerous variations may be made in accordance with the principles of this invention.

What is claimed is:

1. A method of inspecting a mask formed by writing a pattern from pattern data comprising the steps of
   forming a print from the mask on a substrate,
   overlaying on said print a corresponding electron beam pattern or complement thereof from said pattern data, and
   detecting a point of coincidence or noncoincidence of the electron beam pattern with respect to said print.

2. A method as described in claim 1 including the step of forming a plurality of prints on the substrate and comparing a point of coincidence or noncoincidence on one print with at least one of said other prints.

3. A method as described in claim 1 whereby said print is made of gold.

4. A method as described in claim 1 whereby a vector scan system is used to detect points of coincidence and noncoincidence.

5. A method as described in claim 1 whereby the electron beam pattern is registered with said print.

6. A method as described in claim 1 whereby a corresponding electron beam pattern complement from said pattern data is overlaid on said print.

7. A method as described in claim 1 including detecting a plurality of points of coincidence or noncoincidence.

* * * * *